(12) United States Patent
Shi et al.

(10) Patent No.: US 9,903,140 B2
(45) Date of Patent: Feb. 27, 2018

(54) LOCKING APPARATUS

(71) Applicant: Huawei Technologies Co., Ltd., Shenzhen (CN)

(72) Inventors: Chang Shi, Shanghai (CN); Lang Xu, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 685 days.

(21) Appl. No.: 14/462,814

(22) Filed: Aug. 19, 2014

(65) Prior Publication Data

US 2014/0353984 A1  Dec. 4, 2014

Related U.S. Application Data

(63) Continuation of application No. PCT/CN2013/073716, filed on Apr. 3, 2013.

(30) Foreign Application Priority Data

Nov. 5, 2012 (CN) .......................... 2012 1 0436189

(51) Int. Cl.
*E05B 15/02* (2006.01)
*E05B 57/00* (2006.01)
(Continued)

(52) U.S. Cl.
CPC ................ *E05B 57/00* (2013.01); *E05B 7/00* (2013.01); *E05B 15/022* (2013.01);
(Continued)

(58) Field of Classification Search
CPC ... Y10S 292/31; Y10T 292/1039; E05C 3/002
(Continued)

(56) References Cited

U.S. PATENT DOCUMENTS 7,841 A * 12/1850 Lazelle ............... E05B 65/0042
292/242
62,136 A * 2/1867 James ................ E05B 65/0007
292/210

(Continued)

FOREIGN PATENT DOCUMENTS

CN           1110434 A      10/1995
CN        201218397 Y       4/2009

(Continued)

OTHER PUBLICATIONS

Partial English Translation and Abstract of Chinese Patent Application No. CN201309927, dated Mar. 11, 2014, 9 pages.

(Continued)

*Primary Examiner* — Carlos Lugo
(74) *Attorney, Agent, or Firm* — Conley Rose, P.C.

(57) ABSTRACT

A locking apparatus is provided that relates to a fastener and is used to solve a problem that time and labor are consumed and installation efficiency is low in a locking process of an existing locking apparatus. The locking apparatus is configured to lock a first module and a second module, and includes a locking body that is installed on the first module and a locking piece that is installed on the second module. The locking body includes a housing and a rotating block disposed inside the housing, where the rotating block is connected to a handle that drives the rotating block to rotate out of or into the housing, and the locking piece has a notch that accommodates the rotating block. The present invention is used to implement locking between modules.

20 Claims, 13 Drawing Sheets

(51) Int. Cl.
*H05K 5/02* (2006.01)
*E05B 7/00* (2006.01)
*E05C 3/02* (2006.01)
*E05C 3/00* (2006.01)

(52) U.S. Cl.
CPC ......... *H05K 5/0204* (2013.01); *H05K 5/0221* (2013.01); *E05C 3/002* (2013.01); *Y10S 292/31* (2013.01); *Y10T 292/108* (2015.04); *Y10T 292/1039* (2015.04); *Y10T 292/1062* (2015.04); *Y10T 292/1079* (2015.04)

(58) Field of Classification Search
USPC ........ 292/163, 240–242, 288, 336.3, 341.14, 292/341.15, 101, 108, 202, 210
See application file for complete search history.

(56) References Cited

U.S. PATENT DOCUMENTS

| | | | | |
|---|---|---|---|---|
| 335,711 | A * | 2/1886 | Newbory | E05B 65/0042 292/242 |
| 604,187 | A * | 5/1898 | Castle | B62K 21/16 403/96 |
| 665,034 | A * | 1/1901 | Roots | E05F 11/00 292/238 |
| 777,332 | A * | 12/1904 | Casserly | E05B 15/0093 292/108 |
| 797,768 | A * | 8/1905 | Fisher | A45C 13/06 292/204 |
| 888,117 | A * | 5/1908 | Rasmussen | E05B 83/243 105/282.1 |
| 1,358,885 | A * | 11/1920 | Shimocuskies | E05B 63/128 292/341.15 |
| 1,459,701 | A * | 6/1923 | Willis | E05B 63/244 292/175 |
| 1,495,373 | A * | 5/1924 | Witten | E05B 83/02 292/108 |
| 1,615,944 | A * | 2/1927 | Hetrick | E05B 83/02 292/240 |
| 1,869,387 | A * | 8/1932 | McFarland | G07F 17/14 194/212 |
| 2,105,912 | A * | 1/1938 | Franklin | E05B 83/24 292/DIG. 14 |
| 2,767,008 | A * | 10/1956 | Oswald | E06B 3/28 292/202 |
| 2,939,308 | A * | 6/1960 | Trammell, Jr. | E05B 13/106 292/336.3 |
| 3,544,148 | A * | 12/1970 | Sandor | E05B 85/14 292/336.3 |
| 3,958,821 | A * | 5/1976 | Scalera | E05B 13/002 292/240 |
| 4,065,160 | A * | 12/1977 | Gilmore, Jr. | E05B 65/1066 292/288 |
| 4,674,777 | A * | 6/1987 | Guelck | E05C 3/045 292/101 |
| 5,234,238 | A * | 8/1993 | Takimoto | E05B 5/00 292/216 |
| 5,327,798 | A * | 7/1994 | Lerch, Jr. | B62K 21/16 292/137 |
| 5,414,594 | A | 5/1995 | Hristake | |
| 5,865,480 | A * | 2/1999 | Bain, Jr. | E05B 65/0014 292/109 |
| 6,371,424 | B1 * | 4/2002 | Shaw | F16M 11/041 248/187.1 |
| 6,425,612 | B1 * | 7/2002 | Schaeffer | A01K 1/0017 292/238 |
| 7,441,713 | B2 * | 10/2008 | Nguyen | F24H 9/20 219/491 |
| 7,726,706 | B2 * | 6/2010 | Moran | A01K 1/0356 292/194 |
| 8,007,016 | B2 * | 8/2011 | Mantyla | B01D 17/0208 220/4.03 |
| 8,336,930 | B2 * | 12/2012 | Liang | E05B 17/208 292/163 |
| 8,491,022 | B2 * | 7/2013 | Liebel | E05B 7/00 292/336.3 |
| 8,544,904 | B2 * | 10/2013 | Kindig | E05B 85/103 292/336.3 |
| 2006/0284427 | A1 * | 12/2006 | Borycki | E02D 29/1427 292/240 |
| 2007/0085350 | A1 * | 4/2007 | Liang | E05B 41/00 292/240 |

FOREIGN PATENT DOCUMENTS

| | | |
|---|---|---|
| CN | 201309927 Y | 9/2009 |
| DE | 102004018035 A1 | 11/2005 |
| JP | 05145252 A | 6/1993 |
| JP | 2005353941 A | 12/2005 |

OTHER PUBLICATIONS

Foreign Communication From A Counterpart Application, PCT Application No. PCT/CN2013/073716, English Translation of International Search Report dated Aug. 15, 2013, 2 pages.
Foreign Communication From A Counterpart Application, PCT Application No. PCT/CN2013/073716, Written Opinion dated Aug. 15, 2013, 4 pages.

* cited by examiner

LOCKING APPARATUS

CROSS-REFERENCE TO RELATED APPLICATIONS

This application is a continuation of International Application No. PCT/CN2013/073716, filed on Apr. 3, 2013, which claims priority to Chinese Patent Application No. 201210436189.X, filed on Nov. 5, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to a fastener, and in particular, to a locking apparatus used between modules.

BACKGROUND

A conventional wireless site includes units such as an antenna, a radio frequency unit, a baseband unit, and a power supply, and an integration level of each unit module is not high and a volume of each unit module is relatively large. When a site is designed and deployed, each unit module needs to be separately installed. Therefore, more space resources may be occupied and an installation process needs to consume more labor and time.

At present, an adaptive antenna system (AAS) platform product developed by an operator integrates each unit module of the conventional wireless site, so that the wireless site becomes miniaturized, integrated, and intelligent. A typical installation mode of an integrated antenna system is that: a radio frequency module is connected, in a blind-mate manner, to an antenna body by using a connector, and fastened to the antenna body by using a sheet metal mounting kit at the top of the radio frequency module. A fastening manner is to screw screws at four corners of the sheet metal mounting kit into the antenna body. An installation process of the integrated antenna system is that: installation personnel inserts, on the ground, the radio frequency module downward in a vertical direction into the antenna body, then fastens the four corners of the sheet metal mounting kit onto the antenna body by using the screws, and finally lifts an assembled antenna as a whole onto an installation interface for installation.

When the foregoing integrated antenna system is installed, because the radio frequency module and the antenna body are fastened by using screws, operation space of the screws is compact due to a module layout limitation, and an operation must be performed by using a tool. As a result, time and labor are consumed and installation efficiency is low.

SUMMARY

The present invention provides a locking apparatus, so as to solve a technical problem that time and labor are consumed and installation efficiency is low in a locking process of an existing locking apparatus.

According to one aspect, a locking apparatus is provided, which is configured to lock a first module and a second module and includes a locking body that is installed on the first module and a locking piece that is installed on the second module, where the locking body includes a housing and a rotating block disposed inside the housing, the rotating block is connected to a handle that drives the rotating block to rotate out of or into the housing, and the locking piece has a notch that accommodates the rotating block.

In a first possible implementation manner, a rotating shaft is further disposed in the locking body, the rotating block is fixedly connected to one end of the rotating shaft, and the handle is connected to the other end of the rotating shaft.

In a second possible implementation manner, the handle is fixedly connected to the rotating shaft.

In a third possible implementation manner, the handle is connected to the rotating shaft by using a spline.

In a fourth possible implementation manner, the handle is connected to the rotating shaft by means of gear engagement.

With reference to the second possible implementation manner, in a fifth possible implementation manner, the rotating block has a first surface and a second surface along an axial direction of the rotating shaft, the second surface is farther away from the handle than the first surface, the first surface is an inclined plane, and the notch has a sidewall that leans against the inclined plane.

With reference to the fifth possible implementation manner, in a sixth possible implementation manner, the rotating block is of a ratchet structure, the locking piece includes a body and a pawl, the pawl is hinged to the body, and the body and the pawl form the notch.

In a seventh possible implementation manner, a reset spring is further disposed between the body and the pawl, one end of the reset spring is connected to the body, and the other end of the reset spring is connected to the pawl.

In an eighth possible implementation manner, an unlocking button is further disposed on the pawl, and the unlocking button is located on a side that deviates from an inverted tooth on the pawl.

With reference to the third possible implementation manner, in a ninth possible implementation manner, the locking apparatus further includes a fastening block installed on the first module, where a pin hole is disposed on the fastening block, and a pin body that cooperates with the pin hole is disposed on the handle.

In a tenth possible implementation manner, a control button is further disposed on the handle, and the control button is connected to the pin body by using a spring.

In an eleventh possible implementation manner, a distance between a free end of the handle and the rotating shaft is greater than a distance between an outer edge of the rotating block and the rotating shaft.

In a twelfth possible implementation manner, there are four such locking apparatuses that are symmetrically installed in positions close to four corners of the first module and the second module.

In a thirteenth possible implementation manner, the housing is an open-ended cavity disposed on a sidewall of the first module.

According to the embodiments of the present invention, when a locking apparatus is used, a locking body is installed on a radio frequency module, a locking piece is installed on an antenna body, and then the radio frequency module is interconnected to the antenna body. After interconnection, a handle is rotated forwards to enable a rotating block to rotate out of a housing of the locking body and enter a notch of the locking piece. By using the notch to accommodate the rotating block, it is implemented that the radio frequency module is locked and fastened to the antenna body. When the radio frequency module needs to be separated from the antenna body, the handle is reversely rotated to enable the rotating block to rotate out of the notch and rotate into the housing of the locking body, thereby implementing unlocking between the radio frequency module and the antenna body. In locking and unlocking processes of the locking apparatus, time and labor are saved, and installation efficiency is improved.

BRIEF DESCRIPTION OF THE DRAWINGS

The following briefly introduces the accompanying drawings that need to be used in embodiments of the present invention.

DETAILED DESCRIPTION

The following clearly describes the technical solutions in the embodiments of the present invention with reference to the accompanying drawings in the embodiments of the present invention.

In specific embodiments described below, a first module is a radio frequency module, and a second module is an antenna body. When the radio frequency module needs to be mounted on the antenna body, a locking apparatus in the present invention is used to lock and fasten the radio frequency module and the antenna body together. Definitely, the locking apparatus provided by the present invention is not only limited to lock the radio frequency module and the antenna body, but can be used to lock any two modules that have a consistent width and flush sides, thereby implementing installation of modules.

Figure 1:
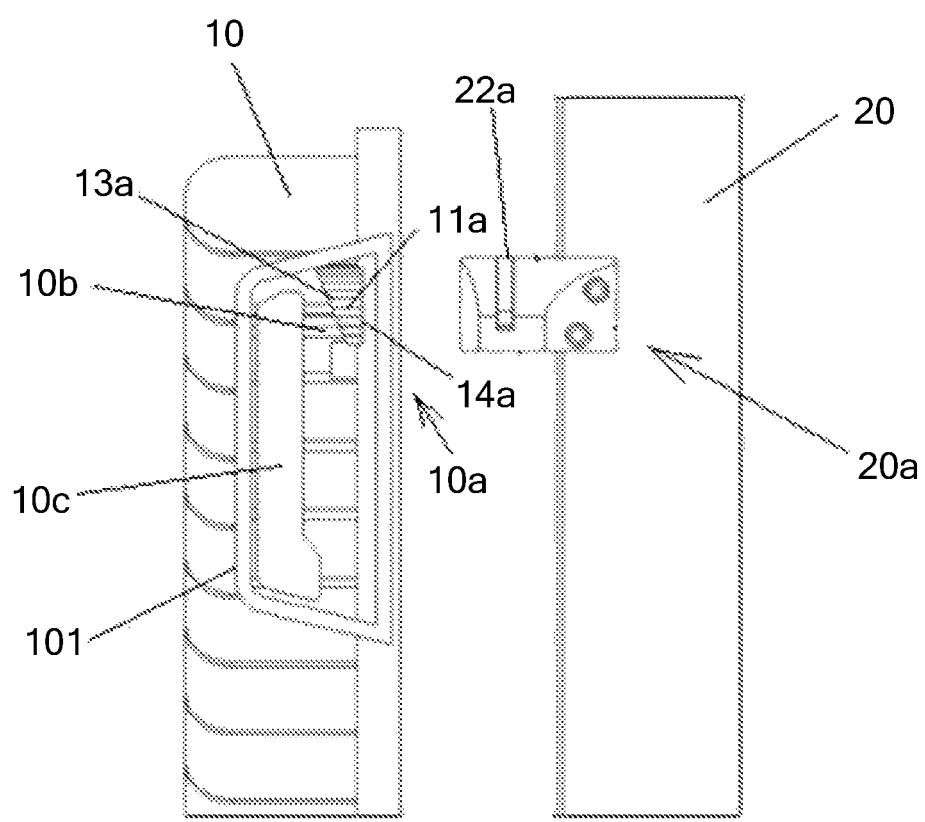
FIG. 1 is a schematic structural diagram of a locking apparatus according to an embodiment of the present invention.

FIG. 1 shows a specific embodiment of a locking apparatus provided by the present invention. The locking apparatus includes a locking body 10a installed on a radio frequency module 10 and a locking piece 20a installed on an antenna body 20. The locking body 10a includes a housing 101 and a rotating block 11a disposed inside the housing 101, the rotating block is connected to a handle 10c that drives the rotating block to rotate out of or into the housing 101, and the locking piece 20a has a notch 22a that accommodates the rotating block 11a.

When the locking apparatus provided by this embodiment of the present invention is used, the locking body 10a is installed on the radio frequency module 10, the locking piece 20a is installed on the antenna body 20, and then the radio frequency module 10 is interconnected to the antenna body 20. After interconnection, the handle 10c is rotated forwards to enable the rotating block 11a to rotate out of the housing 101 of the locking body 10a and enter into the notch 22a of the locking piece 20a. By using the notch 22a to accommodate the rotating block 11a, it is implemented that the radio frequency module 10 is locked and fastened to the antenna body 20. When the radio frequency module 10 needs to be separated from the antenna body 20, the handle 10c is reversely rotated to enable the rotating block 11a to rotate out of the notch 22a and rotate into the housing 101 of the locking body 10a, thereby implementing unlocking between the radio frequency module 10 and the antenna body 20. In locking and unlocking processes of the locking apparatus, time and labor are saved, and installation efficiency is improved.

It can further be seen from FIG. 1 that, in the foregoing embodiment, the housing 101 is an open-ended cavity 101 disposed on a sidewall of the radio frequency module 10, the rotating block 11a is disposed inside the open-ended cavity 101, and the rotating block 11a is rotated out of an opening when being rotated forwards. In this way, the locking body 10a is always installed on the radio frequency module 10, and the radio frequency module 10 and the locking body 10a may be molded into one when the radio frequency module 10 is made. Therefore, product consistency is relatively high and an operation of additionally installing the locking body 10a is also eliminated. Most importantly, the locking body 10a is embedded in the radio frequency module 10. Therefore, there is no exposed protrusion relative to the radio frequency module 10, so that appearance of the radio frequency module 10 is more concise.

Figure 2:
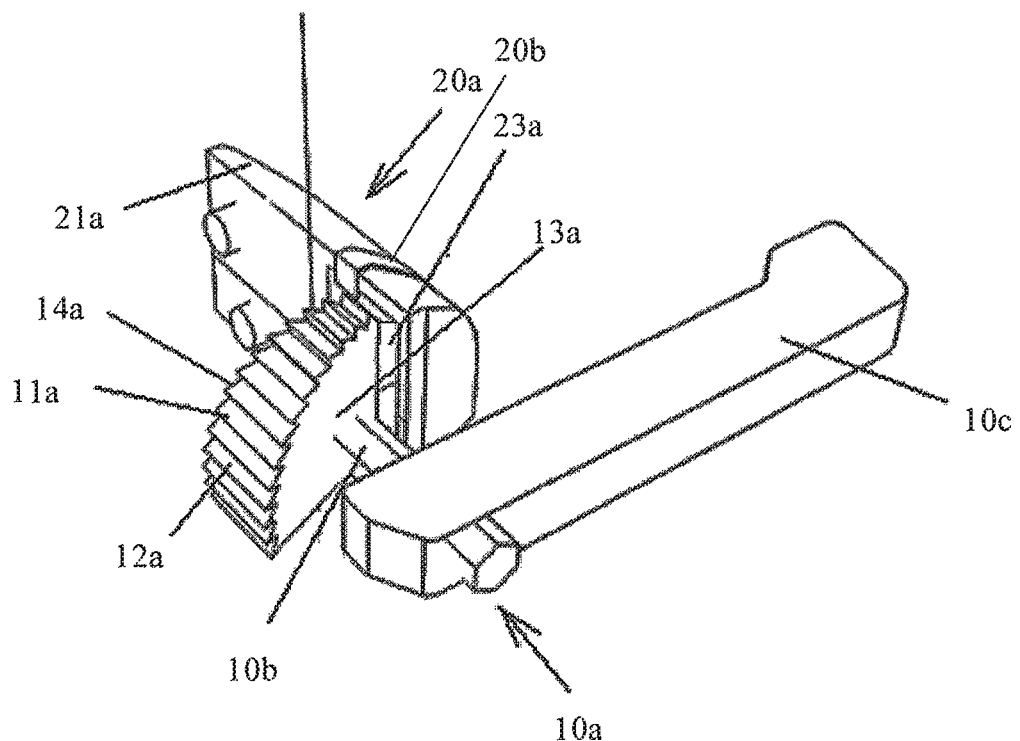
FIG. 2 is a perspective view of a locking apparatus according to an embodiment of the present invention.

It can further be seen from FIG. 1 and FIG. 2 that, the locking body further includes a rotating shaft 10b. The rotating shaft 10b is supported on two opposite sidewalls of the open-ended cavity 101 by using a bearing, the rotating block 11a is fixedly connected to one end of the rotating shaft 10b, and the handle 10c is connected to the other end of the rotating shaft 10b. In this way, the handle 10c, the rotating shaft 10b and the rotating block 11a form a force-saving lever structure. Rotation of the handle 10c drives rotation of the rotating shaft 10b, and the rotating shaft 10b drives rotation of the rotating block 11a. Meanwhile, the handle 10c may be used as a holding place of a hand. Therefore, installation personnel may lift the radio frequency module 10 by holding the handle 10c with hands, to enable the radio frequency module 10 to be interconnected to the antenna body 20, thereby reducing operation difficulty for the installation personnel. The handle 10c and the rotating shaft 10b may be fixedly connected or connected by using a spline or connected by an engaged gear, as long as the rotation of the handle 10c can drive the rotation of the rotating shaft 10b.

It can further be seen from FIG. 1 and FIG. 2 that, the rotating block 11a has a first surface 13a and a second surface 14a along an axial direction of the rotating shaft 10b. The second surface 14a is farther away from the handle 10c than the first surface 13a, the first surface 13a is an inclined plane, and the notch 22a has a sidewall 23a that leans against the inclined plane 13a. That is, the rotating block 11a in this embodiment is a wedge-shaped rotating block. When the wedge-shaped rotating block 11a is rotated forwards and enters the notch 22a, a small end of the rotating block 11a enters first and then a large end of the rotating block 11a enters gradually. Because the inclined plane 13a always leans against the sidewall 23a, when the rotating block 11a is rotated, its second surface 14a is closer to another sidewall that is opposite to the sidewall 23a in the notch 22a. In this way, the rotating shaft 10b is inevitably driven to move close to the antenna body 20 along the axial direction, that is, the radio frequency module 10 moves closer to the antenna body 20 with the rotation of the rotating block 11a, and both of them are pressed tightly and gradually in the axial direction, which avoids an operation of forcibly pressing the radio frequency module 10 towards the antenna body 20 by the installation personnel. In addition, a gradually increased pressing force can better achieve a purpose of good electrical connection and waterproofing of both of them.

It can be seen from FIG. 1 and FIG. 2 again that, as a further improvement of the foregoing embodiment, a distance between a free end of the handle 10c and the rotating shaft 10b is greater than a distance between an outer edge of the rotating block 11a and the rotating shaft 10b. Therefore, in a lever structure that is formed by the handle 10c, the rotating shaft 10b and the rotating block 11a, an arm of force of the handle 10c is greater than an arm of force of the rotating block 11a. Therefore, a larger pressing force is acquired by applying a smaller force on the handle 10c, thereby ensuring reliable pressing and further achieving a purpose of labor saving.

In the foregoing embodiment, when the locking apparatus is locked, to avoid a problem that reverse rotation of the rotating block causes the radio frequency module to be loosened from the antenna body and causes a locking failure, the locking apparatus in the foregoing embodiment is further improved in the present invention.

Figure 3:
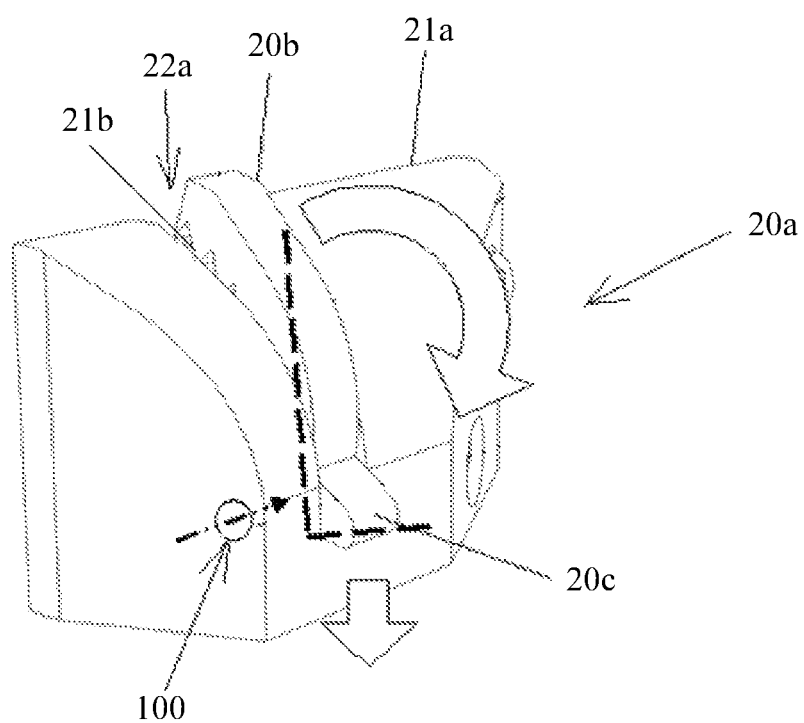
FIG. 3 is a schematic structural diagram of a locking piece shown in FIG. 2.

First type of improvement: reverse rotation of the rotating block in a locking state is directly limited, which is specifically:

As shown in FIG. 2 and FIG. 3, the rotating block 11a is of a ratchet structure, the locking piece 20a includes a body 21a and a pawl 20b, the pawl 20b is hinged to the body 21a by using a hinging shaft 100, and the body 21a and the pawl 20b form the notch 22a. In this way, an inverted tooth 21b of the pawl 20b may cooperate with a ratchet 12a of the ratchet structure 11a to prevent reverse rotation of the rotating block 11a. In this embodiment, by adjusting density of the ratchet 12a and the inverted tooth 21b that cooperates with the ratchet 12, it is implemented that the radio frequency module 10 and the antenna body 20 are continuously locked. The body 21a may be fastened onto a side of the second module 20 by using a screw. The body 21a may also be fastened onto a side of the second module 20 by using a bolt or in another connection manner in which the body 21a may be fastened to the second module 20.

To further fasten the rotating block 11a of a ratchet structure, a reset spring that is not shown in the figures is further disposed between the body 21a and the pawl 20b. One end of the reset spring is connected to the body 21a, and the other end of the reset spring is connected to the pawl 20b.

In this way, tension of the reset spring on the pawl 20b increases pressure of the pawl 20b on the rotating block 11a of the ratchet structure, thereby further preventing reverse rotation of the rotating block 11a.

For convenient unlocking of the locking apparatus, the foregoing embodiment is further improved in the present invention. As shown in FIG. 3, an unlocking button 20c is disposed on the pawl, and the unlocking button 20c is located on a side that deviates from the inverted tooth 21b on the pawl 20b. In this way, the pawl 20b and the unlocking button 20c disposed on the pawl 20b form an "L" shape shown in FIG. 3. When the radio frequency module 10 and/or the antenna body 20 needs to be disassembled for maintenance, the unlocking button 20c may be pressed downwards to enable the pawl 20b to rotate clockwise. In this way, the inverted tooth 21b on the pawl 20b is separated from the ratchet 12a on the ratchet structure 11a, so that the handle 10c may be rotated anticlockwise to enable the rotating block 11a of the ratchet structure to rotate reversely and enter a cavity 101 again, thereby implementing unlocking between the radio frequency module 10 and the antenna body 20. The unlocking button 20c is preferably disposed in a position close to the hinging shaft 100. In this way, during unlocking, an index finger of one hand presses the unlocking button 20c and a ring finger digs out the handle 10c at the same time, thereby implementing installation and maintenance of an antenna by a single person.

Figure 4:
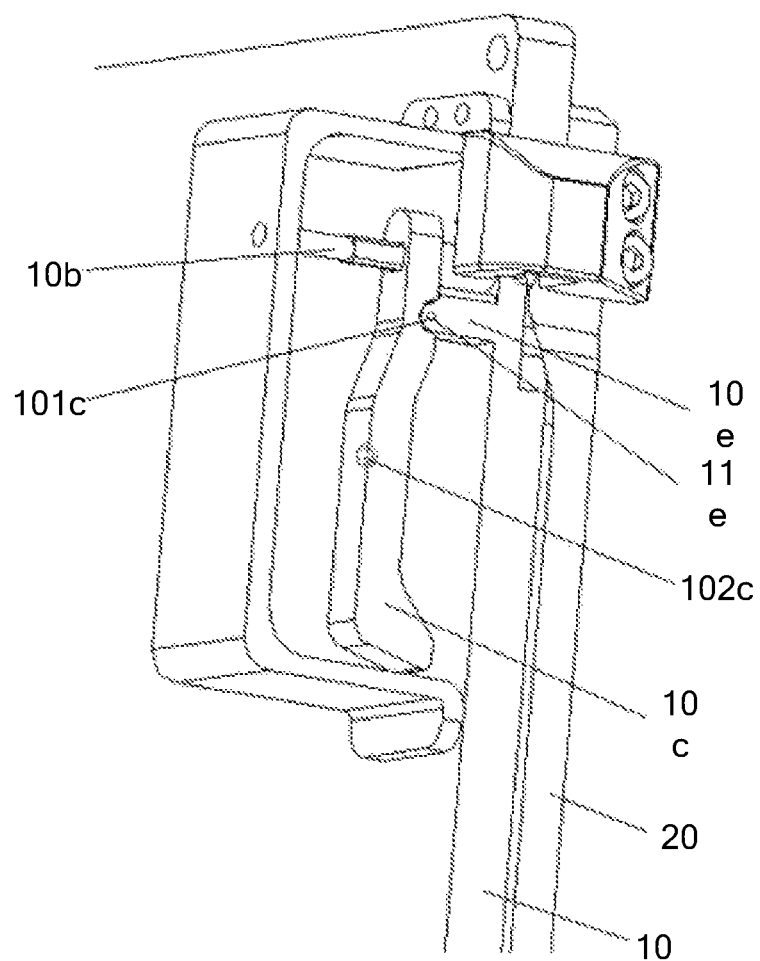
FIG. 4 is another schematic structural diagram of a locking apparatus according to an embodiment of the present invention.
Figure 5:
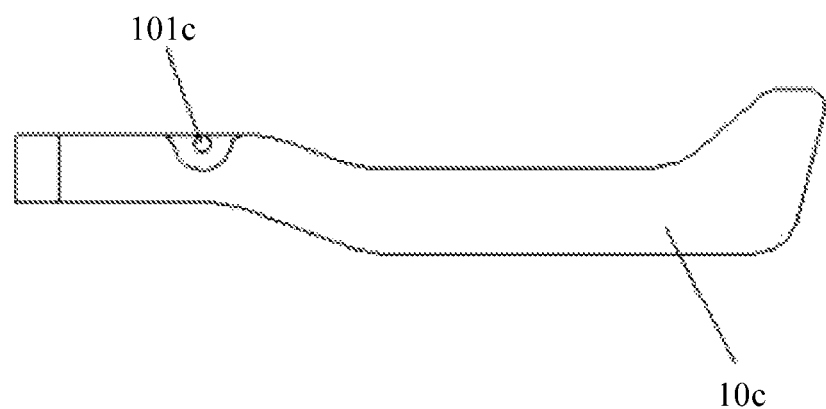
FIG. 5 is a side view of a handle shown in FIG. 4.

Second type of improvement: reverse rotation of the rotating block is indirectly limited by limiting reverse rotation of the handle, which is specifically:

As shown in FIG. 4 and FIG. 5, the handle 10c is connected to the rotating shaft 10b by using a spline (that is, they are connected in a manner of relative moving along an axial direction), a fastening block 10e is disposed on the antenna body 20, a pin hole 11e is disposed on the fastening block 10e, and a pin body 101c that cooperates with the pin hole 11e is disposed on the handle 10c. When the locking apparatus is in a locking state, the handle 10c is moved close to the fastening block 10e by moving the handle 10c along the axial direction of the rotating shaft 10b, so that the pin body 101c is inserted into the pin hole 11e, thereby implementing fastening of the handle 10c.

Figure 6:
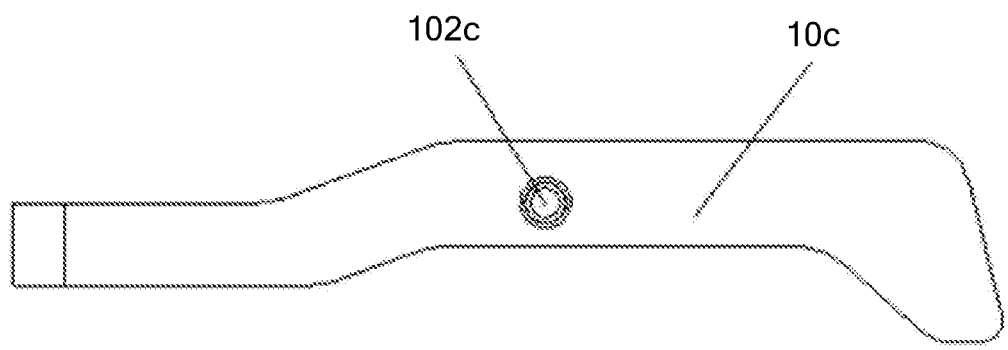
FIG. 6 is another side view of a handle shown in FIG. 4.

As shown in FIG. 5 and FIG. 6, as a further improvement of the foregoing embodiment, a control button 102c is further disposed on the handle 10c, and the control button 102c is connected to the pin body 101c by using a spring that is not shown in the figures. In this way, the pin body 101c can implement a stretch function by using the spring. During unlocking, the installation personnel holds the handle 10c with one hand and at the same time presses the control button 102c to enable the pin body 101c to be retracted and separated from the pin hole 11e, thereby implementing the operation by a single person.

Figure 7:
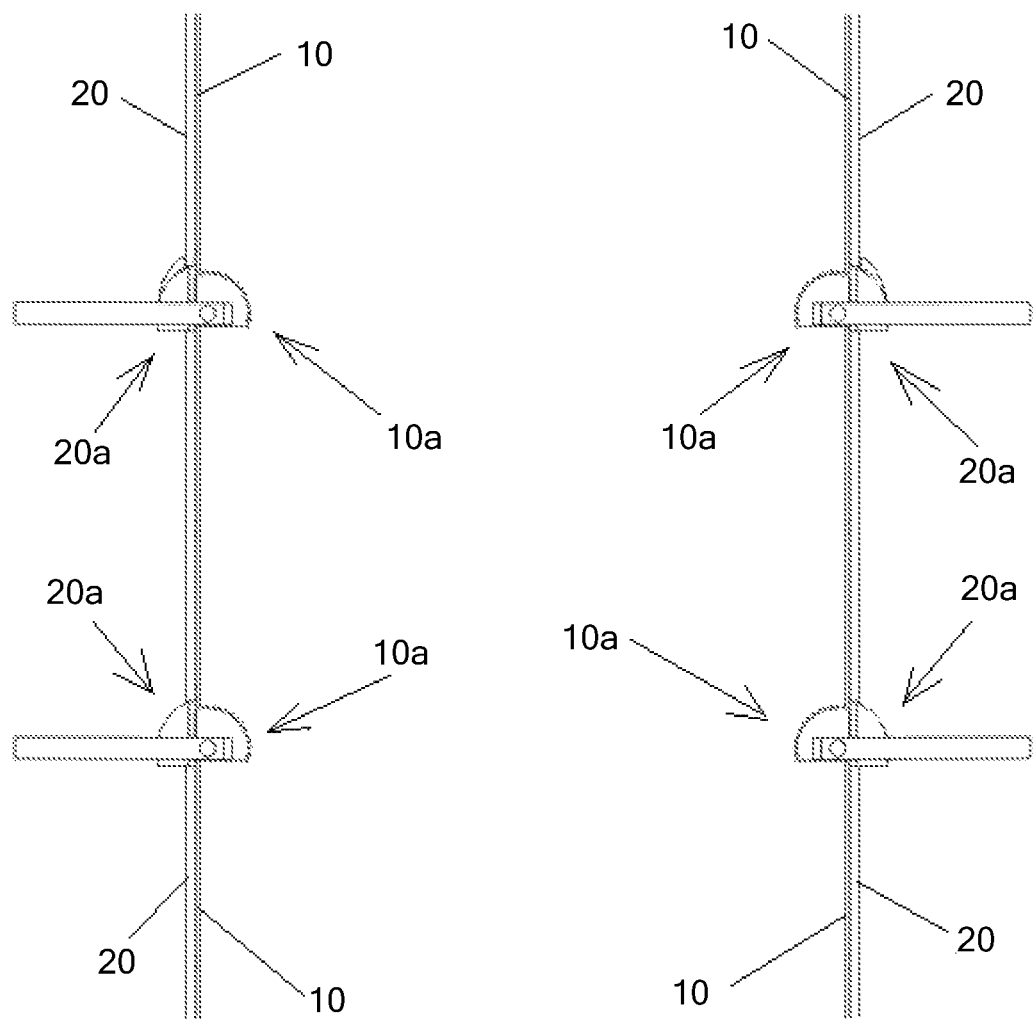
FIG. 7 is a distribution diagram of a locking apparatus according to an embodiment of the present invention.

Preferably, as shown in FIG. 7, there are four such locking apparatuses that are symmetrically installed in positions close to four corners of the radio frequency module 10 and the antenna body 20. Specifically, the locking body 10a is symmetrically disposed in positions close to four corners of the radio frequency module 10, and the locking piece 20a is disposed in a position that is of the antenna body 20 and corresponding to the locking body 10a. In this way, the radio frequency module 10 and the antenna body 20 are symmetrically locked in a four-point manner. Locking force is symmetrical and a locking effect is reliable.

It can further be seen from FIG. 1 that, in a locking state, the entire handle 10c is inside the cavity 101, thereby saving space and making an appearance and a shape of the radio frequency module 10 concise without a protrusion, which needs to be implemented by properly designing a size of the rotating block 11a and a locking degree required by the radio frequency module 10 and the antenna body 20. Details are not described in the present invention.

Figure 8:
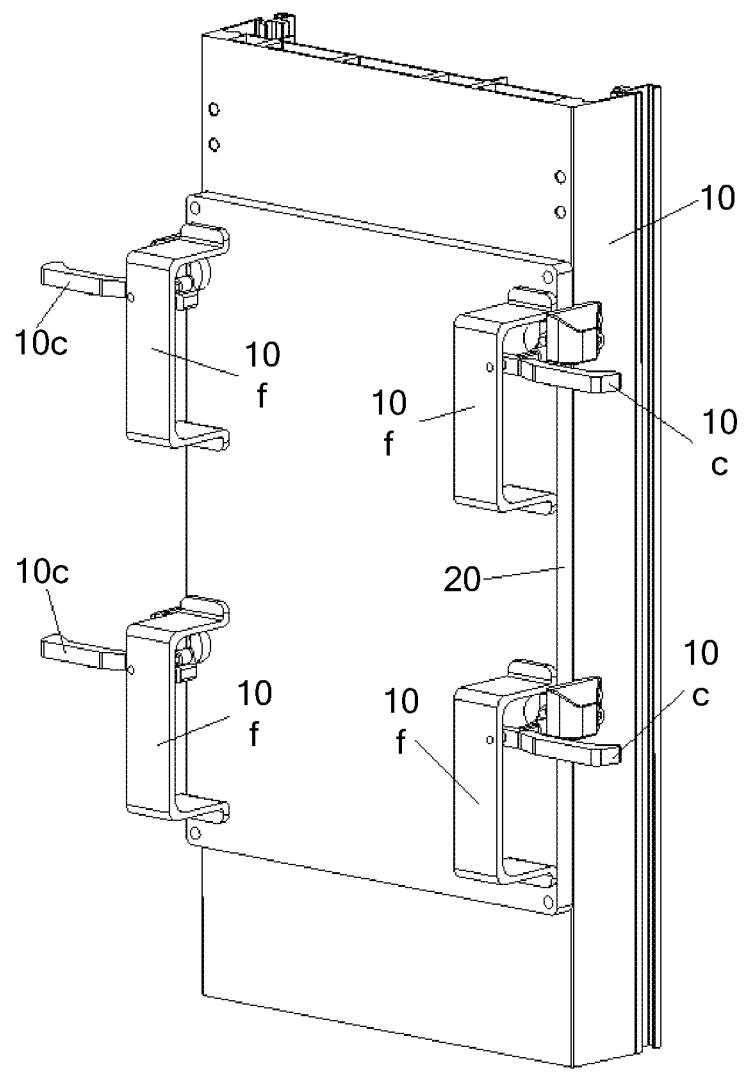
FIG. 8 is another schematic structural diagram of a locking apparatus according to an embodiment of the present invention.
Figure 9:
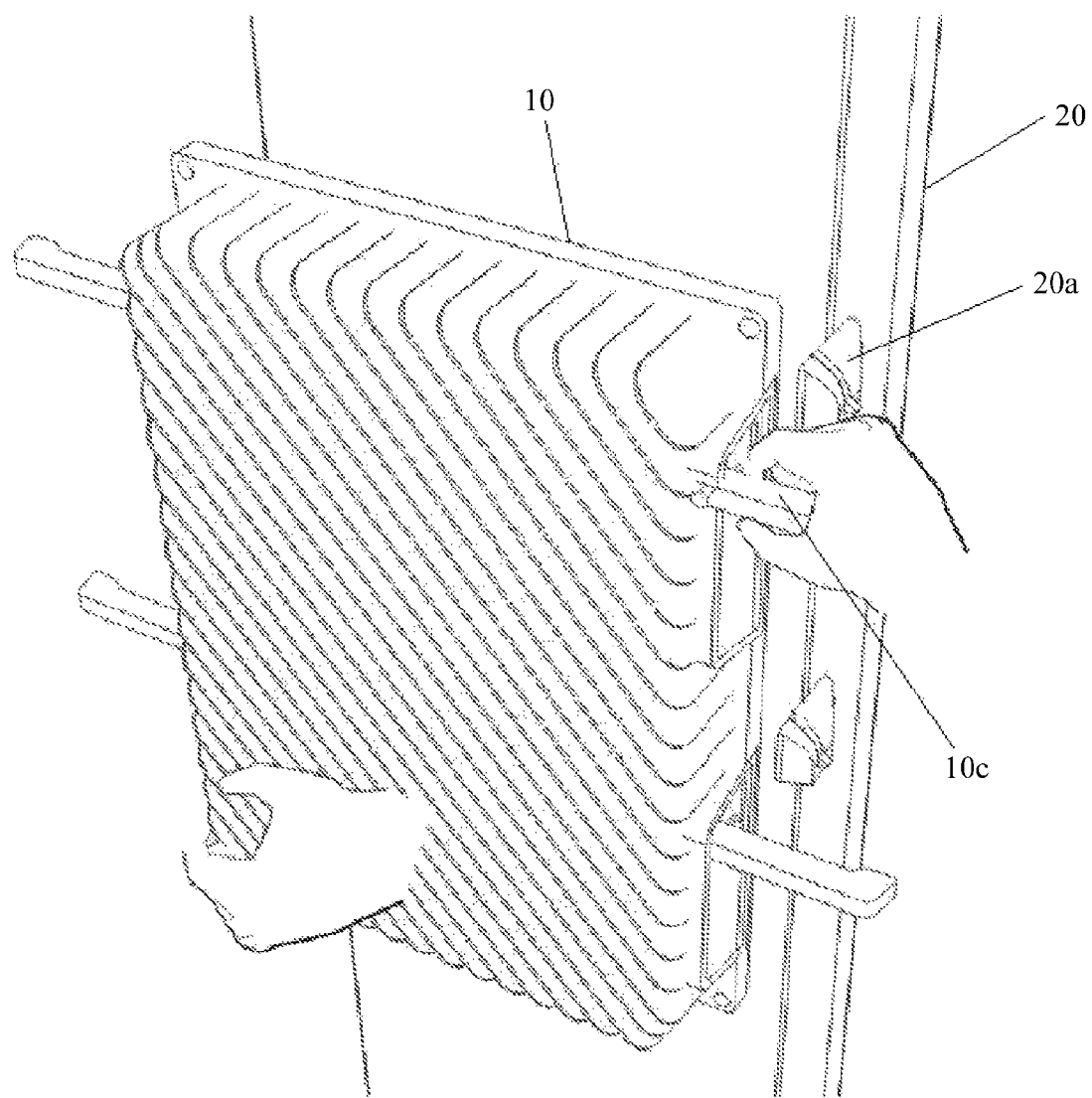
FIG. 9 is a schematic diagram of an open state of a locking apparatus according to an embodiment of the present invention.
Figure 10:
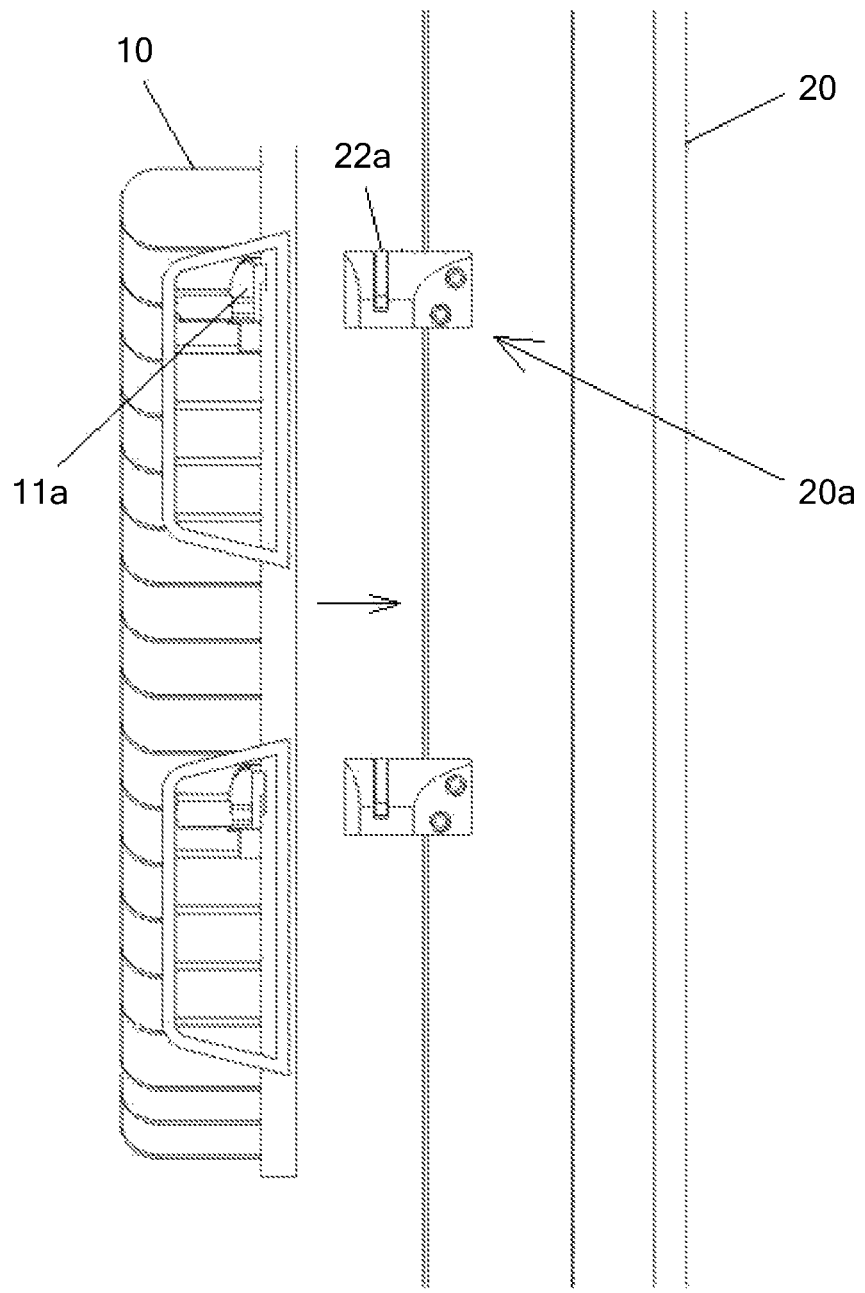
FIG. 10 is another schematic diagram of an open state of a locking apparatus according to an embodiment of the present invention.

As shown in FIG. 8, in an embodiment of the present invention, a buckle 10f may be also separately disposed in positions that are close to four corners of the radio frequency module 10 and located on a surface of the radio frequency module 10. In this way, the installation personnel may lift the radio frequency module 10 by holding the buckle 10f. In addition, the buckle 10f may be further used as a housing of the locking body 10a.

The following specifically describes locking and unlocking processes of a locking apparatus with reference to FIG. 9 to FIG. 13 and by using the radio frequency module and the antenna body as an example.

1. Carrying: A handle 10c in FIG. 9, in an open state, may be used as a holding place for carrying the radio frequency module 10, which facilitates short-distance carrying during on-site installation and position alignment during mounting.

2. Mounting: In a direction shown in FIG. 10, pins on the radio frequency module 10 are aligned to a slot on the antenna body 20 to implement interconnection between the radio frequency module 10 and antenna body 20, to enable that the rotating block 11a aligns with the notch 22a in the locking piece 20a, that is, in a state shown in FIG. 11.

Figure 11:
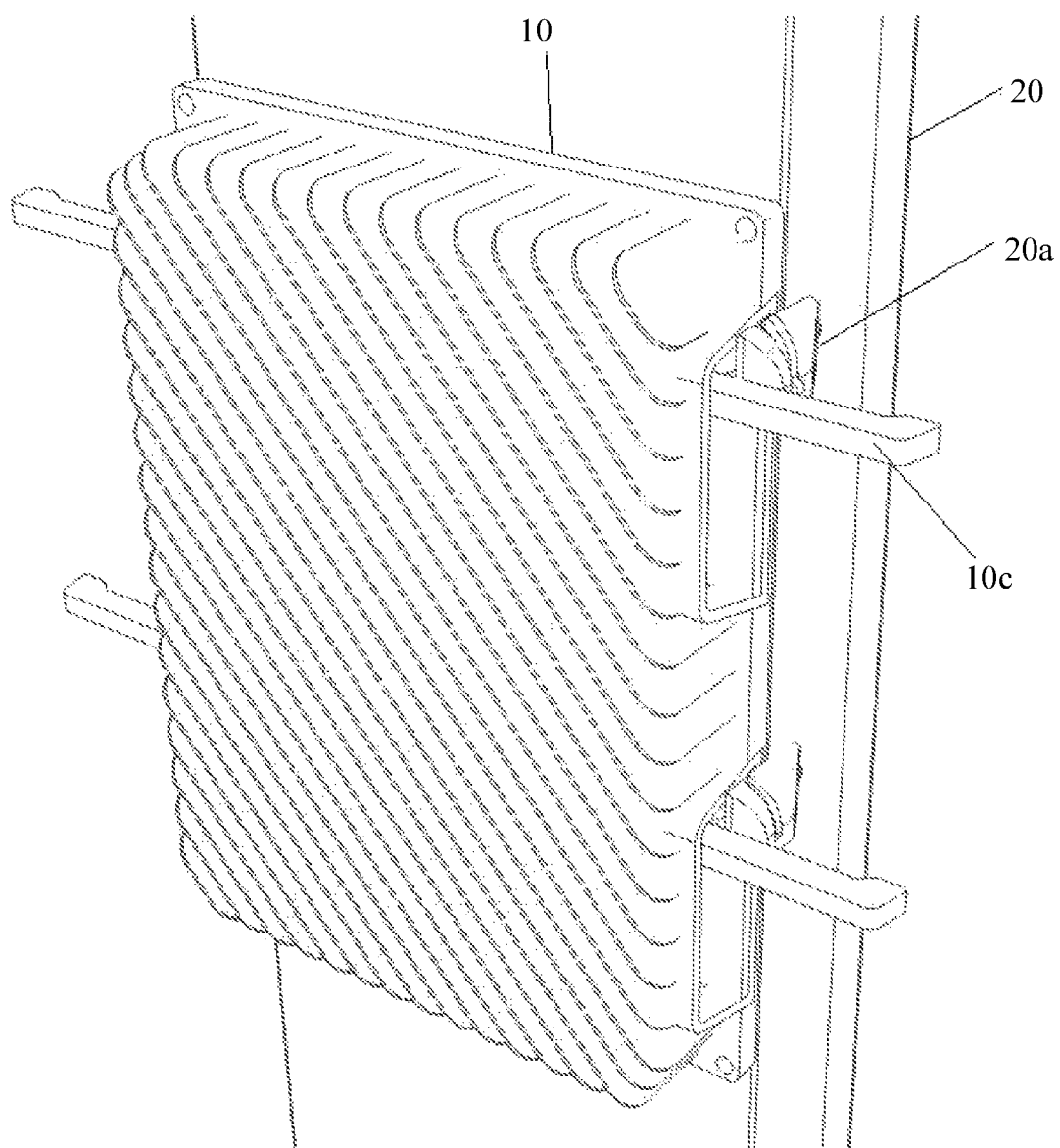
FIG. 11 is another schematic diagram of an open state of a locking apparatus according to an embodiment of the present invention.
Figure 12:
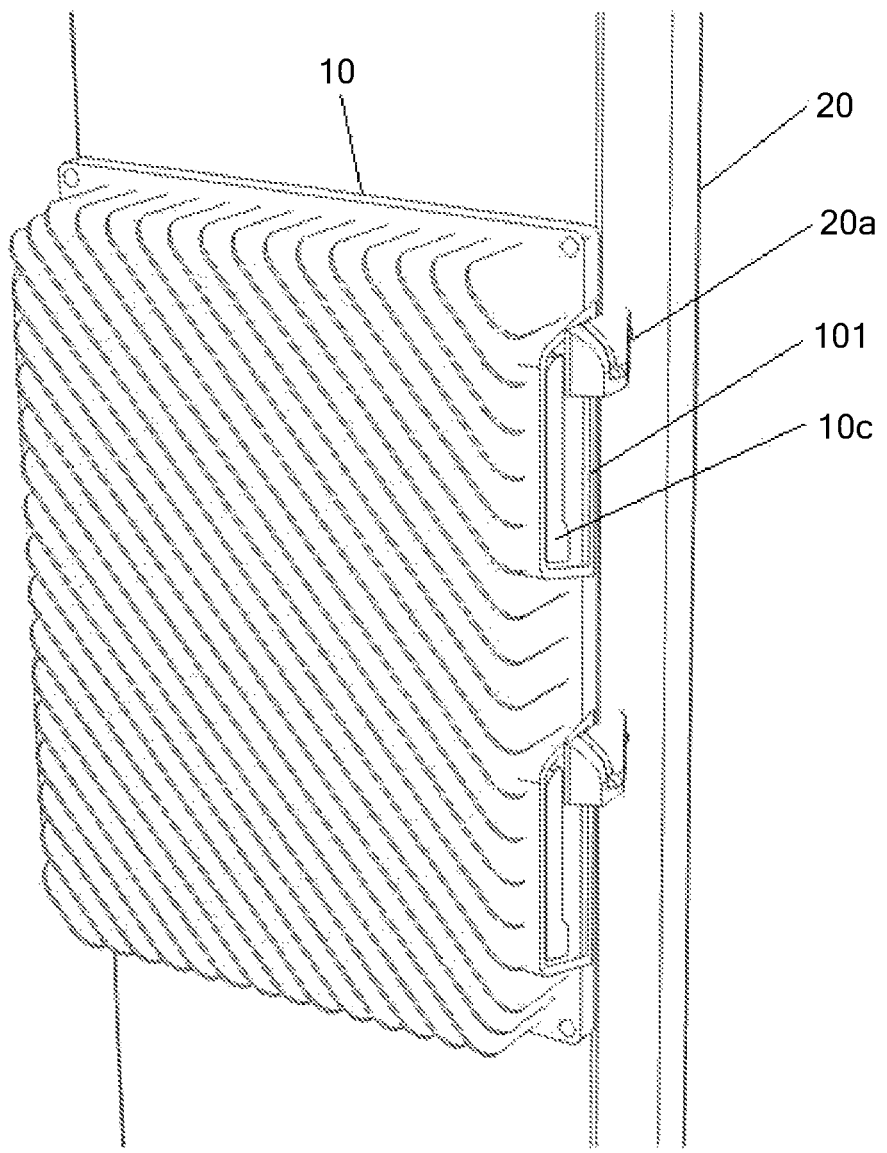
FIG. 12 is a schematic diagram of a locking state of a locking apparatus according to an embodiment of the present invention.

3. Locking: As shown in FIG. 11, after the radio frequency module 10 is interconnected to the antenna body 20, the handle 10c in the locking apparatus in a diagonal direction of the radio frequency module 10 is rotated clockwise until the radio frequency module 10 and the antenna body 20 are locked. FIG. 12 shows an appearance of the locking state.

Figure 13:
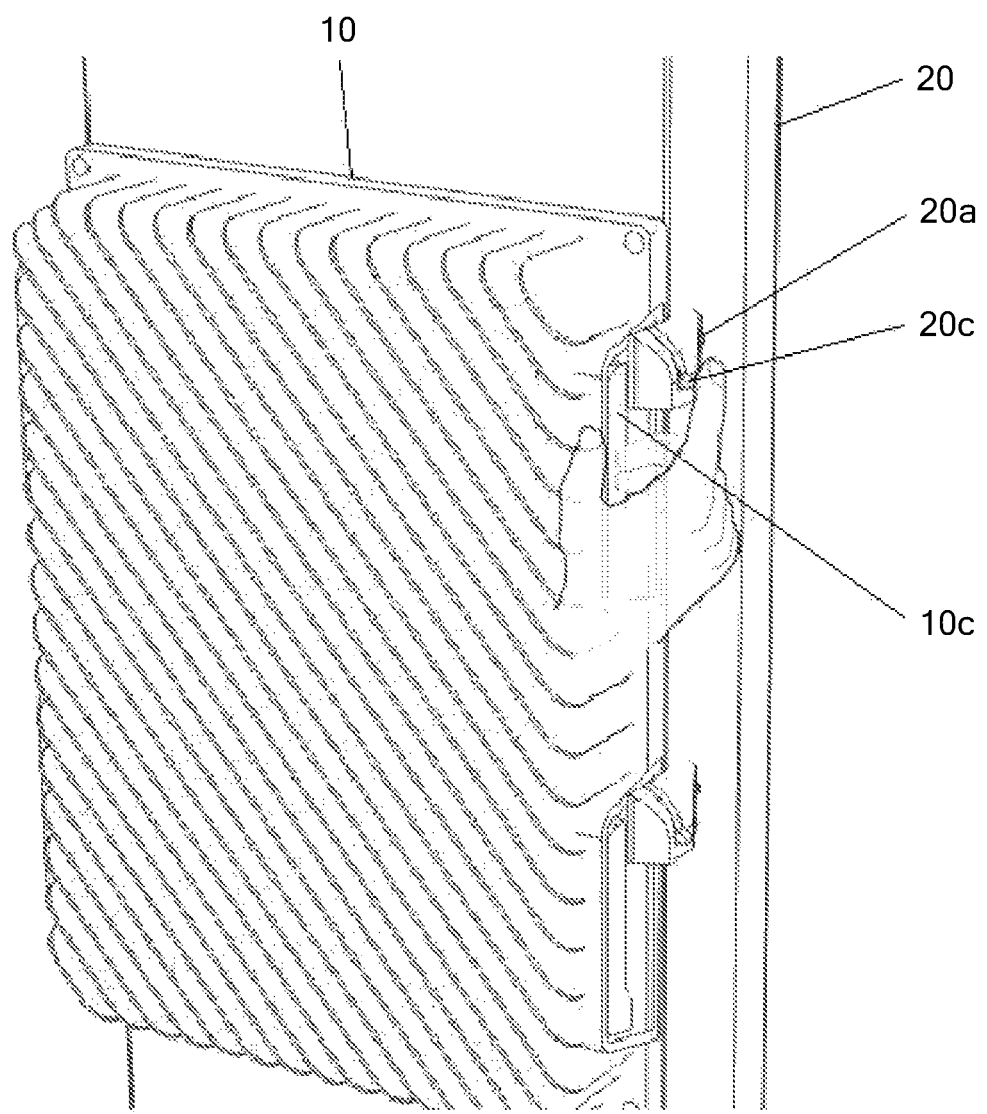
FIG. 13 is another schematic diagram of a locking state of a locking apparatus according to an embodiment of the present invention.

4. Unlocking: When the radio frequency module and/or the antenna body needs to be disassembled for maintenance, as shown in FIG. 13, an operator only needs to press the unlocking button 20c on the locking piece 20a by using an index finger of a hand and dig out the handle 10c by using a ring finger to implement unlocking. After unlocking, the radio frequency module 10 may be removed from the antenna body 20.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A locking apparatus configured to lock a first component part and a second component part, the locking apparatus comprising:
a locking body that is installed on the first component part; and
a locking piece that is installed on the second component part,
wherein the locking body comprises a housing and a rotating block disposed inside the housing,
wherein the rotating block comprises a ratchet structure, wherein the rotating block is connected to a handle that drives the rotating block to rotate out of or into the housing,
wherein the locking piece comprises:
a body defining a notch;
a pawl; and
an unlocking button disposed on the pawl,
wherein the pawl protrudes out from the body defining the notch when the unlocking button is actuated,
wherein the unlocking button is configured to be manually pressed to separate an inverted tooth of the pawl from the ratchet structure,
wherein the notch is configured to receive the rotating block, and
wherein the pawl is configured to move and engage the ratchet structure to secure the rotating block within the locking piece.

2. The locking apparatus according to claim 1, wherein a rotating shaft is further disposed in the locking body, wherein the rotating block is fixedly connected to one end of the rotating shaft, and wherein the handle is connected to the other end of the rotating shaft.

3. The locking apparatus according to claim 2, wherein the handle is fixedly connected to the rotating shaft.

4. The locking apparatus according to claim 2, wherein the handle is connected to the rotating shaft by using a spline.

5. The locking apparatus according to claim 4, further comprising a fastening block installed on the first component part, wherein a pin hole is disposed on the fastening block, and a wherein pin body that cooperates with the pin hole is disposed on the handle.

6. The locking apparatus according to claim 5, wherein a control button is farther disposed on the handle, and wherein the control button is connected to the pin body.

7. The locking apparatus according to claim 2, wherein the locking piece further comprises a hinging shaft, and wherein the pawl is hingedly connected via the hinging shaft to the body defining the notch.

8. The locking apparatus according to claim 7, wherein the pawl and the unlocking button form an L shape, and wherein the hinging shaft is located proximate to the unlocking button at an intersection of the pawl and the unlocking button.

9. The locking apparatus according to claim 2, wherein the rotating block has a first surface and a second surface along an axial direction of the rotating shaft, wherein the second surface is farther away from the handle than the first surface, wherein the first surface is an inclined plane, and wherein the notch has a sidewall that leans against the inclined plane.

10. The locking apparatus according to claim 2, wherein a distance between a free end of the handle and the rotating shaft is greater than a distance between an outer edge of the rotating block and the rotating shaft.

11. The locking apparatus according to claim 1, wherein the pawl comprises a plurality of inverted teeth configured to receive and secure the ratchet structure of the rotating block.

12. The locking apparatus according to claim 11, wherein the unlocking button is located on a side of the pawl that deviates from the plurality of inverted teeth.

13. The locking apparatus according to claim 1, comprising four locking apparatuses that are symmetrically installed in positions close to four corners of the first component part and the second component part.

14. The locking apparatus according to claim 1, wherein the housing is an open-ended cavity disposed on a sidewall of the first component part.

15. An apparatus, comprising:
   a handle;
   a locking body comprising a housing and a rotating block, wherein the rotating block is connected to the handle, wherein the handle drives the rotating block to rotate out of or into the housing, and wherein the rotating block comprises a ratchet structure; and
   a locking piece comprising a body defining a notch, a pawl hinged to the body, and an unlocking button on the pawl, wherein the pawl is configured to move and engage the ratchet structure to secure the rotating block, wherein the pawl protrudes out from the body defining the notch when the unlocking button is actuated, and wherein the unlocking button is configured to be manually pressed to separate an inverted tooth of the pawl from the ratchet structure.

16. The apparatus according to claim 15, wherein a rotating shaft is further disposed in the locking body, wherein the rotating block is fixedly connected to one end of the rotating shaft, and wherein the handle is connected to the other end of the rotating shaft.

17. The apparatus according to claim 15, wherein the handle is fixedly connected to the rotating shaft.

18. An apparatus, comprising:
   a rotating block comprising a ratchet structure;
   a handle connected to the rotating block via a rotating shaft; and
   a locking piece comprising a body, a pawl, and an unlocking button on the pawl, wherein the pawl is hinged to the body, wherein the pawl is configured to move and engage the ratchet structure to secure the rotating block, wherein the pawl protrudes out from the body when the unlocking button is actuated, and wherein the unlocking button is configured to be manually pressed to separate an inverted tooth of the pawl from the ratchet structure.

19. The apparatus according to claim 18, wherein the rotating block is fixedly connected to one end of the rotating shaft, and wherein the handle is connected to the other end of the rotating shaft.

20. The apparatus according to claim 18, wherein the pawl and the unlocking button form an L shape, wherein the locking piece further comprises a hinging shaft that hingedly connects the pawl to the body, and wherein the hinging shaft is located proximate to the unlocking button at an intersection of the pawl and the unlocking button.

* * * * *

UNITED STATES PATENT AND TRADEMARK OFFICE
CERTIFICATE OF CORRECTION

PATENT NO.          : 9,903,140 B2
APPLICATION NO.     : 14/462814
DATED               : February 27, 2018
INVENTOR(S)         : Chang Shi and Lang Xu Page 1 of 1

It is certified that error appears in the above-identified patent and that said Letters Patent is hereby corrected as shown below:

On the Title Page

On page 2 item (56) under U.S. Patent Documents should read:
1,459,701 A 6/1923 Dellmont In the Claims Column 8; Line 35; Claim 6 should read:
control button is further disposed on the handle, and wherein Signed and Sealed this
Twenty-fourth Day of April, 2018

Andrei Iancu
*Director of the United States Patent and Trademark Office*